United States Patent [19]

Wu

[11] Patent Number: 5,797,667
[45] Date of Patent: Aug. 25, 1998

[54] HARD DISK CASE MOUNTING STRUCTURE

[76] Inventor: Ching Hsiu Wu, 8th Fl. No.957, Chung Shan Rd., Sec. 2, Taishan Hsiang, Taipei Hsien, Taiwan

[21] Appl. No.: 688,761

[22] Filed: Jul. 31, 1996

[51] Int. Cl.$^6$ ................................................ H05K 7/16
[52] U.S. Cl. ................ 312/332.1; 361/725; 361/685; 312/348.6; 312/223.2
[58] Field of Search ........................ 361/685, 725, 361/726, 727; 16/110 R, 112, 110.5, 111 R; 312/332.1, 348.1, 348.6, 348.2, 348.4, 223.2

[56] References Cited

U.S. PATENT DOCUMENTS

| | | | |
|---|---|---|---|
| 3,039,837 | 6/1962 | Poe | 312/332.1 |
| 3,313,586 | 4/1967 | McClintock | 312/332.1 |
| 3,988,802 | 11/1976 | Bruni et al. | 312/332.1 X |
| 5,020,151 | 5/1991 | Sampei et al. | 361/725 X |
| 5,208,735 | 5/1993 | Twachtmann et al. | 312/332.1 X |
| 5,403,064 | 4/1995 | Mahler et al. | 16/112 X |
| 5,563,767 | 10/1996 | Chen | 361/685 |

*Primary Examiner*—Peter M. Cuomo
*Assistant Examiner*—Stephen Vu
*Attorney, Agent, or Firm*—Donald C. Casey, Esq.

[57] ABSTRACT

A hard disk case mounting structure includes an auxiliary stop bar provided at either side of a front end of a hard disk frame for preventing a pull handle on a case of the hard disk frame from being forcefully pulled up, thereby protecting the hard disk lock. Besides, the relative movement between the pull handle and the auxiliary stop bar may result in a counter force between the case and a mounting frame to cause two connecting ports to be separated to permit smooth removal of the hard disk.

1 Claim, 8 Drawing Sheets

PRIOR ART   Fig 1

HARD DISK CASE MOUNTING STRUCTURE

BACKGROUND OF THE INVENTION (a) Field of the Invention

The present invention relates generally to a hard disk case mounting structure, and more particularly to a device for locking the hard disk case to prevent the hard disk from being removed when it is in a locked state.

(b) Description of the Prior Art

FIGS. 1 to 3 illustrate a prior hard disk case mounting structure designed by the invention of the present invention. It essentially comprises a case B provided with a pull handle B3 at a front end thereof, the pull handle having a retain hole B33 at one side thereof at a suitable position; a mounting frame C having a hard disk lock C7 at one side thereof and a linking-up pull handle lock C8 below the hard disk lock C7. The pull handle lock C8 consists of a linking-up block C82 and a spring C83 located in a slide rail C81 thereof for causing the hard disk lock C7 to reset when the hard disk is locked. The linking-up block C82 has one end thereof projecting into the retain hole B33 of the pull handle B3 so that the pull handle B3 cannot be pulled out. When the hard disk lock C7 is in an unlocked state, a rotary rod C71 of the hard disk lock C7 may press against a projecting portion C821 of the linking-up block C82 to cause the end of the linking-up block C82 to disengage from the retain hole B33 of the pull handle B3. A spring strip B5 is provided at the case B to facilitate pulling of the pull handle B3.

However, there are two major setbacks with this prior design. Firstly, if the user forcefully pulls the pull handle when the hard disk is locked, the projecting end of the linking-up block may be easily damaged; as a result, the entire protection mechanism is damaged. Secondly, when the hard disk is locked and the pull handle is not properly positioned, the projecting end of the linking-up block may not be properly retained by the retain hole of the pull handle and has to be manually positioned.

SUMMARY OF THE INVENTION

Accordingly, a primary object of the present invention is to provide an improved hard disk case mounting structure to eliminate the drawbacks with the prior art.

BRIEF DESCRIPTION OF THE DRAWINGS

The foregoing and other features and advantages of the present invention will be more clearly understood from the following detailed description and the accompanying drawings, in which.

DETAILED DESCRIPTION OF THE PREFERRED EMBODIMENT

Figure 1:
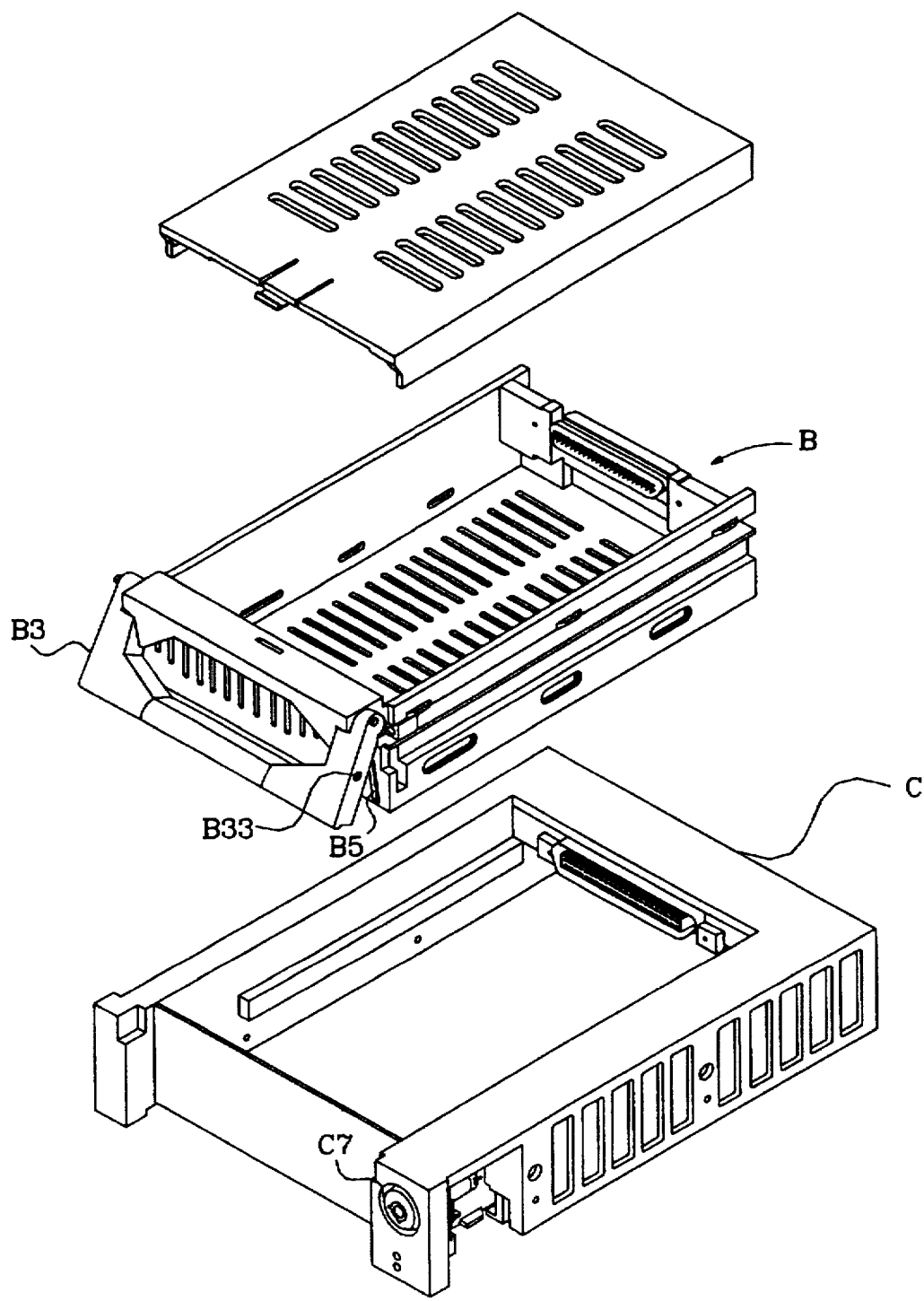
FIG. 1 is an elevational exploded view of a prior hard disk case mounting structure.
Figure 2:
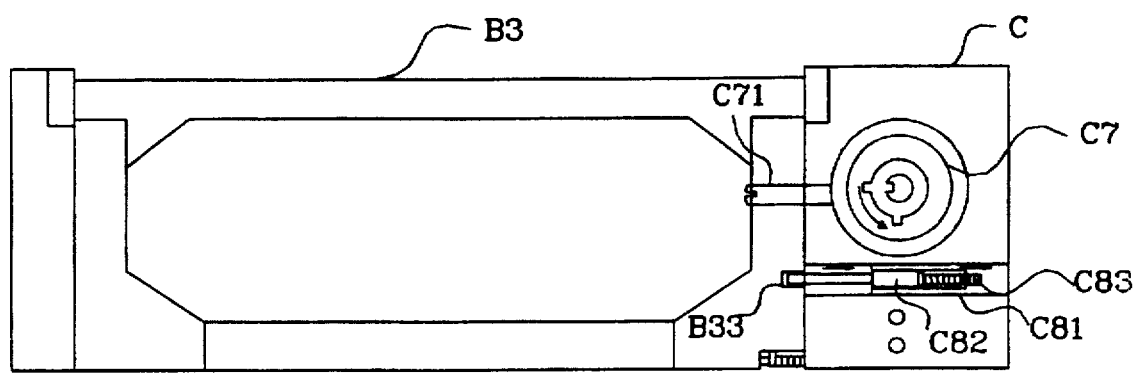
FIG. 2 is a schematic view illustrating unlocking of a pull handle lock of the prior hard disk case mounting structure.
Figure 3:
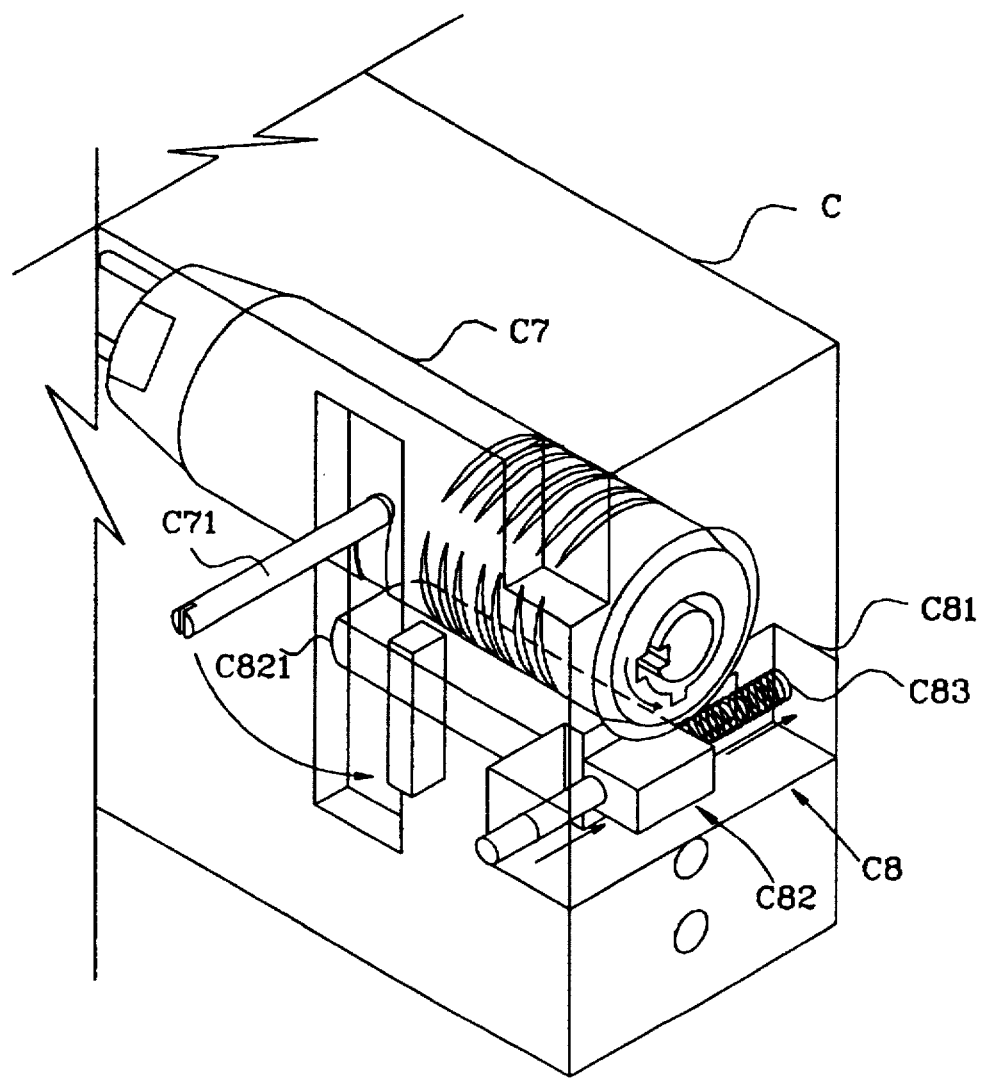
FIG. 3 is a schematic view illustrating the pull handle lock of the prior hard disk case mounting structure.
Figure 4:
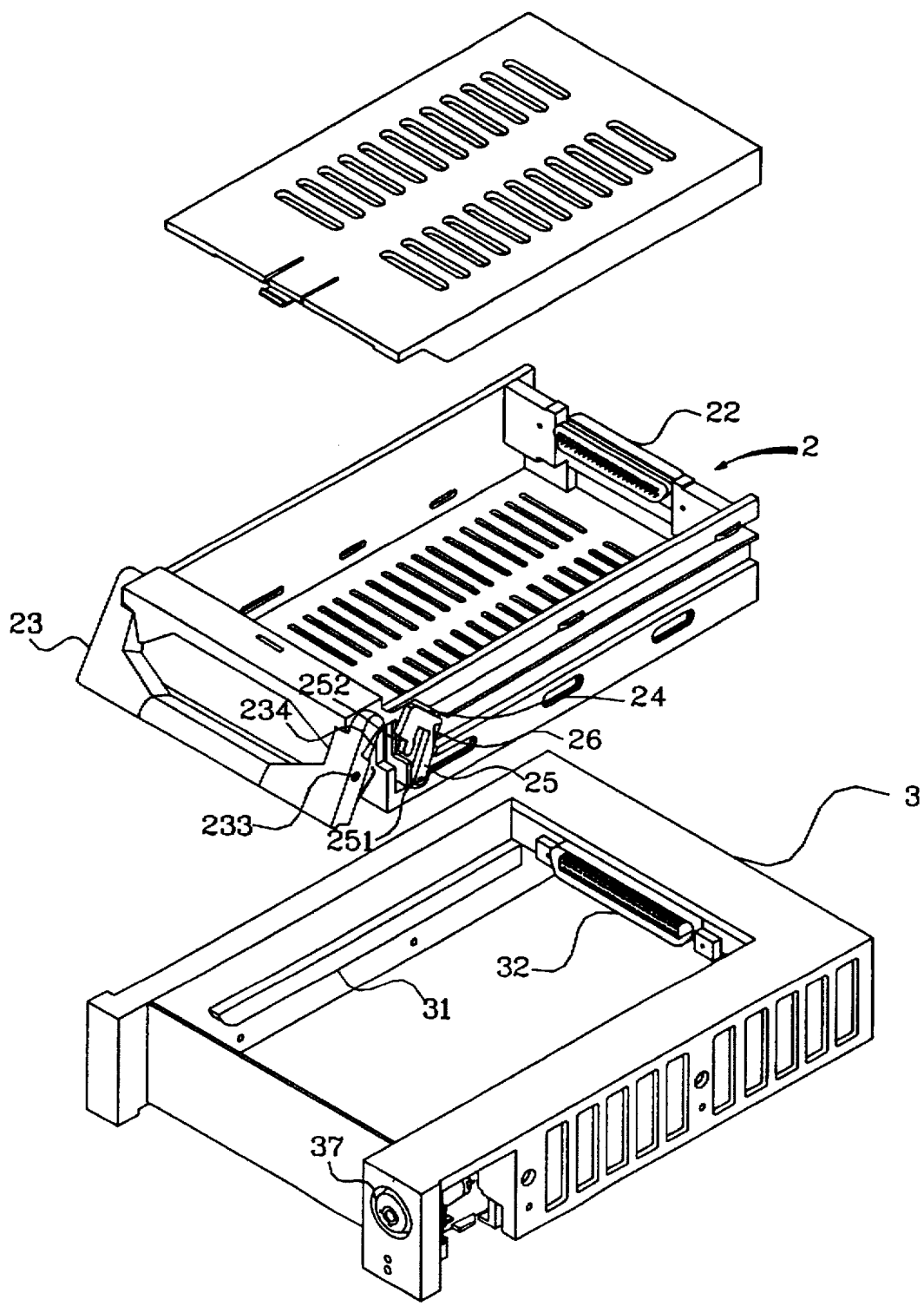
FIG. 4 is an elevational exploded view of the hard disk case mounting structure of the invention.
Figure 5:
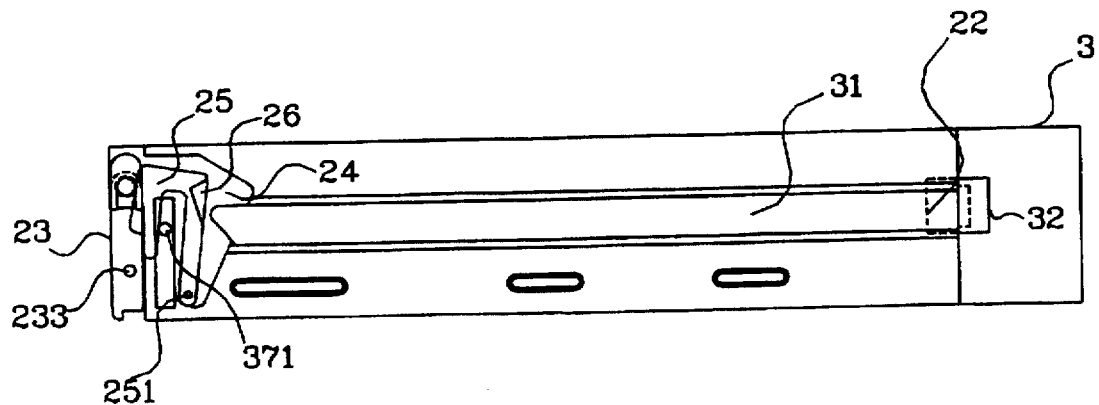
FIG. 5 is a schematic view illustrating operation of the present invention.
Figure 6:
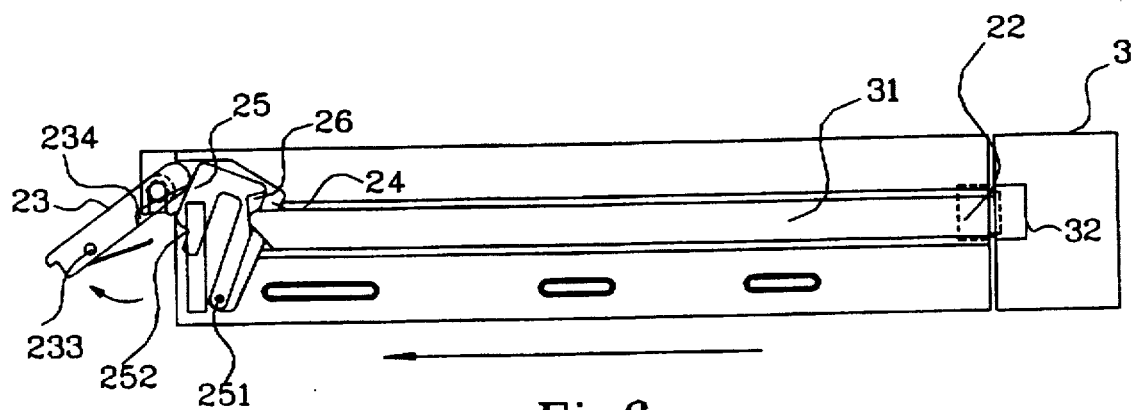
FIG. 6 is another schematic view illustrating operation of the present invention.
Figure 7:
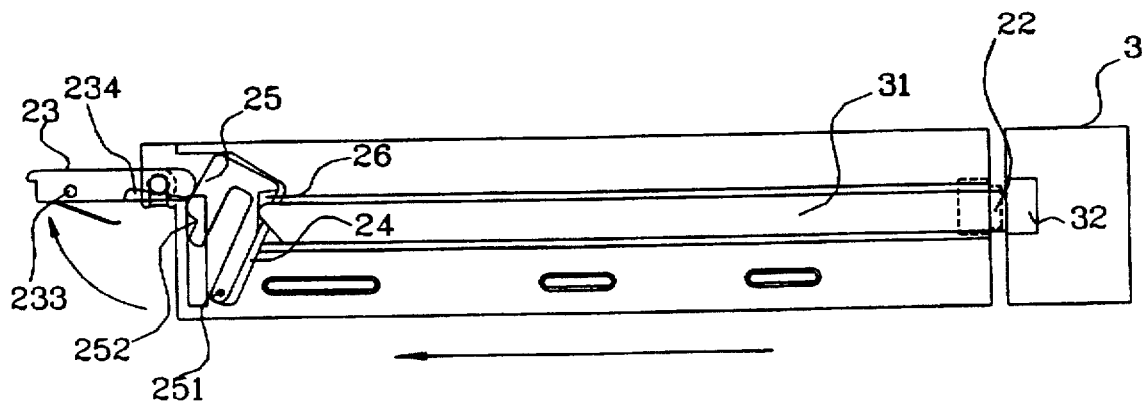
FIG. 7 is still another schematic view illustrating operation of the present invention.
Figure 8:
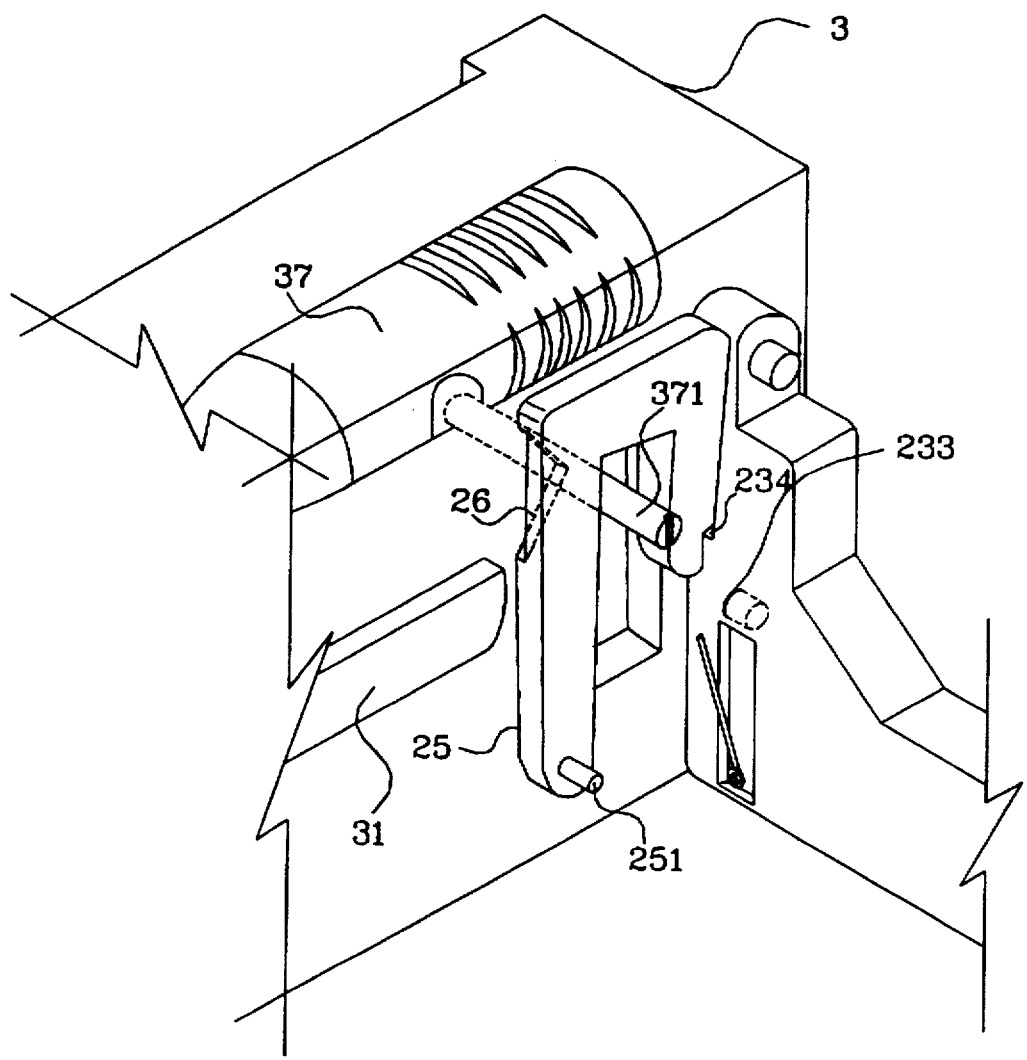
FIG. 8 is a schematic view illustrating an auxiliary stop bar abutting a pull handle of the present invention.
Figure 9:
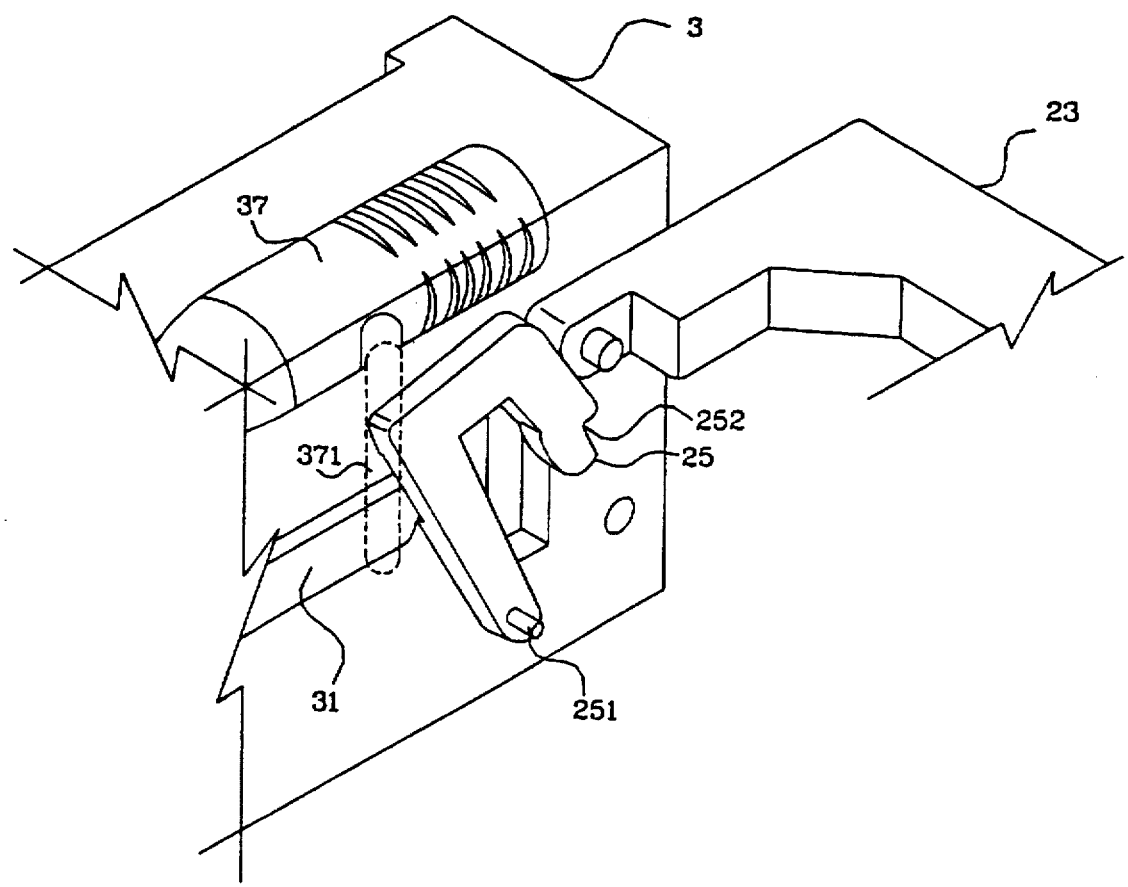
FIG. 9 is a schematic view illustrating the relationship between the pull handle and the auxiliary stop bar when the pull handle is pulled.
Figure 10:
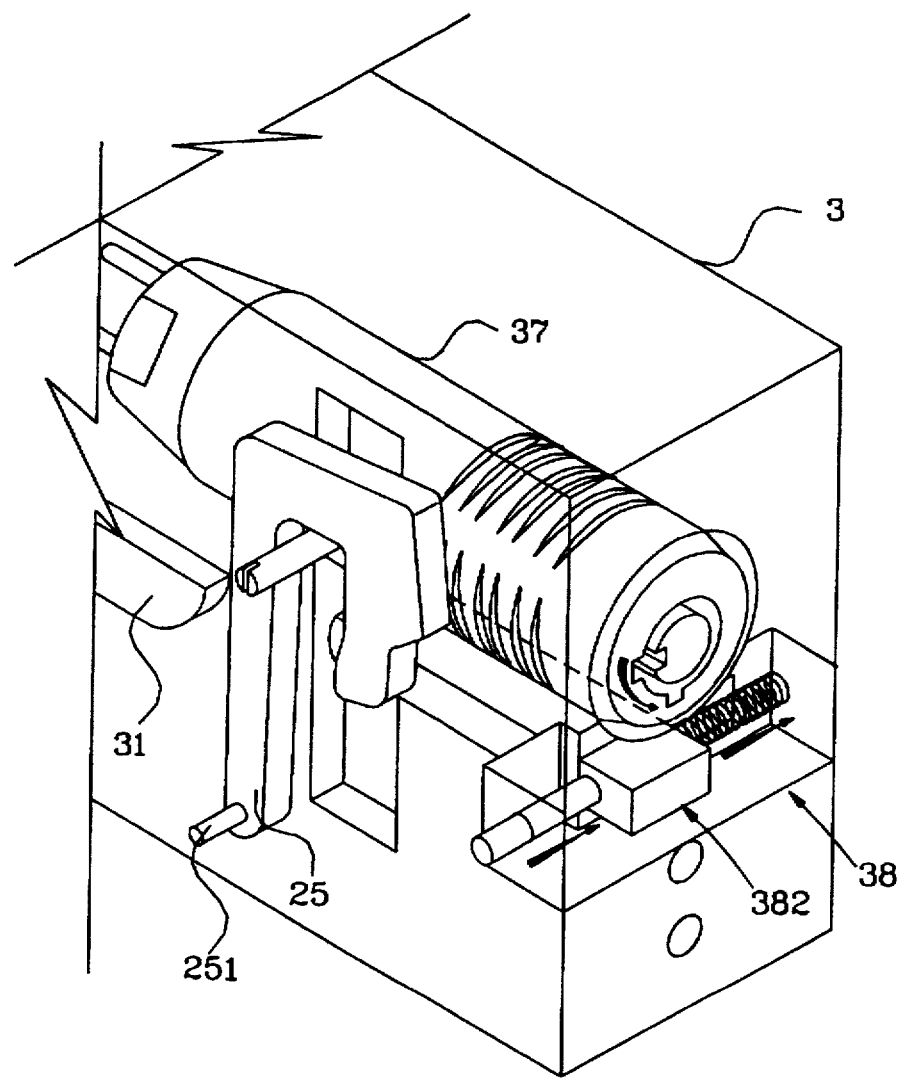
FIG. 10 is elevational view illustrating the auxiliary stop bar and a hard disk lock in part.

With reference to the drawings, the mounting case mounting structure according to the present invention is essentially comprised of a pull handle 23, a case 2, and a mounting frame 3.

The pull handle 3 has curved pivot ends and a hole 233 at a lateral side thereof at a suitable position. Furthermore, a depressed triangular stop portion 234 is formed at either lateral side thereof near the pivotal ends. The case 2 is provided with a securing element 24 at both side walls thereof such that a substantially L-shaped auxiliary stop bar 25 may be pivotally secured by means of a pivot 251 in the securing element 24 so that the auxiliary stop bar 25 may turn through a suitable angle. The lower portion of each mounting frame 24 is configured to be substantially slanting so that a rotary rod 371 of a hard disk lock 37 may force the pull handle 23 to be positioned. The securing element 37 further has an extreme end wall configured to match the shape of the auxiliary stop bar 25. Correspondingly, the auxiliary stop bar 25 is provided with an indented triangular baffle portion 26 at an upper lateral side thereof. The mounting frame 3 is provided with two corresponding protrudent rails 31 at both inner lateral side walls. The protrudent rails 31 are configured to curve downwardly near their respective extreme ends such that, when the pull handle 23 is turned to push the auxiliary stop bar 25, the baffle portion 26 of which will press the protrudent rails 31 of the mounting frame 3, so that two connecting ports 22 and 32 may be separated to allow smooth removal of the hard disk. The above-mentioned hard disk lock 37 is disposed at a suitable position of the mounting frame 3 for preventing the hard disk from being stolen. A linking-up pull lock 38 is disposed below the hard disk lock 37 for preventing the pull handle 23 from being pulled upwardly when the hard disk lock 37 is at a locked state by causing one end of a linking-up block 382 to project into the hole 233 of the pull handle 23. Besides, as the space below the auxiliary stop bar 25 may just accommodate the projecting rotary rod 371 when the hard disk lock 37 is at a locked state to cause a notch 252 of the auxiliary stop bar 25 to lie close against the stop portion 234 of the pull handle 23, the pull handle 23 may be firmly positioned, thereby preventing the pull handle 23 from being pulled upwardly when the hard disk lock 37 is in a locked stated.

In summary, the present invention has the following advantages:

1. Simple construction: The hard disk may be conveniently removed by means of the counter action generated when the pull handle 23 turns to push the auxiliary stop bar 25 to press in turn against the protrudent rails 31 of the mounting frame 3. Few structural parts are needed to achieve the object and they are less likely to be damaged.

2. Dual protection: The arrangement of the hole 233 for retaining one end of the linking-up block 382 on the pull handle 23 and that of the auxiliary stop bar 25 for lying closely against the pull handle 23 so that the pull handle 23 may be firmly positioned when the hard disk is locked effectively prevents the pull handle 23 from being pulled upwardly, thereby protecting the hard disk against possible damage.

3. Convenience: The counter action of the auxiliary stop bar 25 and the configuration of the slanting of the inner side thereof facilitates removal of the hard disk and permits precise resetting of the pull handle 23.

Although the present invention has been illustrated and described with reference to the preferred embodiment thereof, it should be understood that it is in no way limited to the details of such embodiment but is capable of numerous modifications within the scope of the appended claims.

What is claimed is:

1. A hard disk case mounting structure comprising a case provided with a pull handle at a front end thereof, said pull handle being provided with an indented triangular stop portion at either lateral side thereof, said case having an indented securing element provided on both lateral side walls thereof, said securing element receiving a substantially L-shaped auxiliary stop bar which is secured in said securing element by means of a pivot and may rotate through a suitable angle, said securing element having a rear side wall configured to match the shape of said auxiliary stop bar, said auxiliary stop bar being provided with an indented triangular stop portion at an upper lateral side thereof; and a mounting frame provided with two protrudent rails at both inner side walls thereof respectively, said rails being configured to curve downwardly at their extreme ends such that when said pull handle is turned to push said auxiliary stop bar said auxiliary bar in turn presses against said rails to permit smooth removal of the hard disk; said auxiliary stop bar further having an inner side thereof configured to be slanting such that, when a rotary rod of a hard disk lock forces said pull handle to be positioned in the process of locking said auxiliary stop bar has a notch thereof lying close against said stop portion of said pull handle to prevent said pull handle from being pulled upwardly.

* * * * *